(12) United States Patent
Hiramatsu

(10) Patent No.: US 8,272,515 B2
(45) Date of Patent: Sep. 25, 2012

(54) PACKAGED ARTICLE CONTAINING ELECTRONIC DEVICE

(75) Inventor: Masayuki Hiramatsu, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 0 days.

(21) Appl. No.: 12/594,937

(22) PCT Filed: Apr. 9, 2008

(86) PCT No.: PCT/JP2008/057389
§ 371 (c)(1),
(2), (4) Date: Feb. 11, 2010

(87) PCT Pub. No.: WO2008/126938
PCT Pub. Date: Oct. 23, 2008

(65) Prior Publication Data
US 2010/0200457 A1    Aug. 12, 2010

(30) Foreign Application Priority Data
Apr. 11, 2007 (JP) .................... 2007-104052

(51) Int. Cl.
*B65D 85/00* (2006.01)
(52) U.S. Cl. .................. 206/713; 428/35.7; 428/354
(58) Field of Classification Search ........... 206/713, 206/714, 725; 428/35.7, 335–355 EN
See application file for complete search history.

(56) References Cited

U.S. PATENT DOCUMENTS

| 5,208,103 | A | * | 5/1993 | Miyamoto et al. | 428/354 |
| 5,369,179 | A | | 11/1994 | Havens | |
| 5,599,621 | A | | 2/1997 | Akhter | |
| 5,691,038 | A | * | 11/1997 | Hirata et al. | 428/354 |
| 5,846,621 | A | * | 12/1998 | Nagamatsu | 428/40.1 |
| 5,846,652 | A | * | 12/1998 | Yamashita | 428/354 |

(Continued)

FOREIGN PATENT DOCUMENTS

EP         0476895      3/1992

(Continued)

OTHER PUBLICATIONS

Extended European Search Report for corresponding EP Application No. 08740470.3-1217, Sep. 28, 2010.

*Primary Examiner* — Bryon Gehman
(74) *Attorney, Agent, or Firm* — Ditthavong Mori & Steiner, P.C.

(57) ABSTRACT

A packaged article containing an electronic device which comprises an electronic device-packaging carrier tape and an electronic device-packaging cover tape, wherein a layer in the cover tape contacting with the carrier tape contains an adhesive resin (A), an electrically-charged resin. (B) charging opposite to the charging polarity of the adhesive resin (A) generating at the time of friction between the adhesive resin (A) and the electronic device, and a metallic filler and/or carbon, and wherein the packaged article containing an electronic device is capable of preventing the adhesion of the electronic devices to the cover tape (pickup failure) resulting from the static and the part breakage by ESD, by inhibiting the static caused by the friction between the contained electronic devices, particularly small/light weight electronic devices, and the cover tape.

7 Claims, 1 Drawing Sheet

U.S. PATENT DOCUMENTS

| | | | |
|---|---|---|---|
| 6,027,802 A * | 2/2000 | Lin | 428/343 |
| 6,030,692 A * | 2/2000 | Auger | 428/349 |
| 6,787,224 B2 * | 9/2004 | Nakanishi et al. | 428/354 |
| 7,014,896 B1 * | 3/2006 | Miyakawa et al. | 428/35.7 |
| 7,097,900 B2 * | 8/2006 | Oda et al. | 206/713 |
| 7,316,791 B2 * | 1/2008 | Meloni et al. | 252/500 |
| 7,364,778 B2 * | 4/2008 | Miyakawa et al. | 428/35.7 |
| 7,455,896 B2 * | 11/2008 | Fujimura et al. | 428/35.7 |

FOREIGN PATENT DOCUMENTS

| | | |
|---|---|---|
| EP | 1553142 | 7/2005 |
| JP | 2001-179870 | 7/2001 |
| JP | 2003-128132 | 5/2003 |
| JP | 2004-196979 | 7/2004 |
| JP | 2007-38664 | 2/2007 |

* cited by examiner

PACKAGED ARTICLE CONTAINING ELECTRONIC DEVICE

TECHNICAL FIELD

The present disclosure relates to a packaged article containing electronic device having function to protect the electronic device, from pollution during storage, transportation and mounting of the electronic device and to bring them into line and remove to apply the device in electronic circuit substrate.

BACKGROUND OF THE DISCLOSURE

Surface-mount electronic devices such as, including IC, transistor, diode, condenser, and piezo element register are supplied with packed in a packaged article comprising, according to the electronic device's shape, a carrier tape equipped with trays containing embossed pockets and pockets continuously, and a cover tape being heat-sealable to the carrier tape. The carrier tape packaging the electronic devices is usually wrapped around a reel made of paper or plastic and kept the condition until mounting process. The content, that is electronic device, is automatically removed from the carrier tape after detachment of the tray or the cover tape and surface mounted on the electronic circuit substrate.

Recently, because reductions in size and weight are promoted, a problem that can be solved in the case of electronic devices having conventional size and weights arises. That is, with the reduction in size and weight, static sensitivity devices increased and process troubles resulting from the static began to arise. Among the electronic devices, especially in the semiconductor devices field, because it is difficult to maintain conventional electrostatic breakdown property with the improvement in integration and miniaturization, the breakage of devices resulting from electro-static discharge (ESD) happen in the production process of semiconductor devices manufacturer or fabrication process of semiconductor devices user. In the other fields than semiconductor parts, the breakage of electronic devices resulting from ESD is very rare, but the reduction in size and weight is rapidly promoted concerning electronic parts which are mounted in the recent electronic equipments. In such small and light weight electronic devices, the charged electronic devices adhere to the cover tape because the charging between the cover tape and the devices occurs as a result of the friction during transit, so that it causes process troubles such as pickup failure.

As for the action for the charge produced by friction with the devices, a method of adding a low-molecular surfactant to a resin which contacts with the device and causes friction has been proposed as described in Japanese Kokai Publication 2004-196979. However, when the low-molecular surfactant is used in the side which makes contact with the cover tape part (heat seal side), problems such as failure of the heat seal and the peeling with time are caused because the bleed out happens and the adhesive property of the adhesive resin is inhibited.

DISCLOSURE OF INVENTION

Object of the Disclosure

According to the above mentioned state of the art, the object of the present disclosure is to provide a packaged article containing an electronic device being capable of preventing the adhesion of the electronic devices to the cover tape (pickup failure) resulting from the static and the part breakage caused by ESD, by inhibiting the static caused by the friction between the contained electronic devices (especially small/light weight electronic devices) and the cover tape.

Problem to be Solved by the Invention

The present disclosure relates to a packaged article containing an electronic device which comprises an electronic device-packaging carrier tape and an electronic device-packaging cover tape, wherein a layer in said cover tape contacting with said carrier tape contains an adhesive resin (A) and an electrically-charged resin (B) charging opposite to the charging polarity of said adhesive resin (A) generating at the time of friction between said adhesive resin (A) and said electronic device.

The electrically-charged resin (B) is preferably a positive charging resin or a negative charging resin.

The electrically-charged resin (B) preferably has a polar group.

The electrically-charged resin (B) is preferably a styrene-acrylic copolymer having a quaternary ammonium base or a styrene-acrylic copolymer obtained by using 2- acrylamide-2- methyl propanate as a monomer.

The cover tape is preferably a multilayer film having at least three layers comprising a substrate layer, an intermediate layer, and a heat sealant layer and said heat sealant layer contacts with the carrier tape.

An addition amount of the electrically-charged resin (B) is preferably 1 to 100 parts by weight relative to 100 parts by weight of the resin component in the layer contacting with the carrier tape.

The layer contacting with the carrier tape preferably contains a conductive substrate of 30 to 1000 parts by weight relative to 100 parts by weight of the resin component and the surface resistance value of the layer is $1 \times 10^4$ to $1 \times 10^{12} \Omega/\square$.

The present disclosure is described in more detail below.

The layer contacting with the carrier tape of the cover tape in the packaged article containing an electronic device of the present disclosure contains an electrically-charged resin (B) taking charge opposite to the charging polarity of the adhesive resin (A) caused by friction between the adhesive resin (A) in the layer and the electronic devices. That is, when the adhesive resin (A) charges positively in the friction between the adhesive resin (A) and the electronic device, a resin which charges negatively is added, when the adhesive resin (A) charges negatively, a resin which charges positively is added.

When a layer not containing the electrically-charged resin (B) is used as the layer contacting with the carrier tape in the cover tape, the combination of the materials composing the adhesive resin (A) and the electronic device varies whether the layer charged positively or negatively. The present disclosure was completed by finding that the prevention of the problems such as a pickup failure and static breakage of electronic devices caused by ESD can be achieved by confirming the charging generated in the adhesive resin (A) when the layer contacting with the carrier tape is formed in the cover tape without using this electrically-charged resin (B), and using a component which charges opposite to the above-mentioned charging as the electrically-charged resin (B) in combination.

The static between the electronic device and the cover tape is mainly generated by transportation after taping (heat sealing the cover tape to the carrier tape), or vibrating in the mounting process. In the present disclosure, because the electrically-charged resin (B) making charge opposite to the charging polarity (static) generated in the adhesive resin (A)

is added, each charge negates each other. By negating each other, it becomes possible to reduce surface potential generated on the electronic device and efficiently inhibit the static generation between the electronic device and the cover tape. As a result, it is possible to sufficiently prevent the pickup failure caused by static attraction acting between the cover tape and the electronic device, and the static breakage of the electronic device caused by ESD.

These are the problem that occurs remarkably not in packaged article containing a normal-sized and normal-weight electronic device but mainly in packaged article containing a small-sized and light weight electronic device, by taking the above-mentioned means, the problem can be inhibited to occur in the case of the small-sized and light weight devices. Specifically, for example, the above-mentioned effect can be obtained because the charge quantity generated in the side of the electronic device is reduced below ±0.3 nC when the layer contacting with carrier tape in the cover tape of the present disclosure and five electronic devices (size: 1 mm×2 mm×1 mm) are subjected to vibrate at 600 rpm/min. for three minutes.

Hereinafter, the packaged article containing an electronic device of the present invention will be concretely described with referent to the drawings. But the present disclosure is not limited to the drawings.

The packaged article containing an electronic device of the present disclosure comprises a cover tape for packaging an electronic device (hereinafter referred to as cover tape) and a carrier tape for packaging an electronic device which contains an electronic device (hereinafter referred to as carrier tape). That is, in the present disclosure, the packaged article containing an electronic device means an article in which the electronic device is packaged in a packaging container.

FIG. 1 is a cross-section drawing illustrating an embodiment of layer constitution of the cover tape 1 used in the present disclosure, and it shows a cover tape comprising a multilayer film which contains a substrate layer 2, an adhesive layer 5, an intermediate layer 3, and a heat sealant layer 4. FIG. 2 is a view showing an embodiment of a packaged article containing an electronic device 11 of the present disclosure using the cover tape 1 of FIG. 1, and shows the packaged article containing an electronic device wherein an electronic device 12 is contained in a carrier tape 13 and the carrier tape 13 is heat-sealed with the cover tape 1.

In the present disclosure, the cover tape is a lid material of the carrier tape and includes a tape heat-sealable with the carrier tape.

The layer contacting with the carrier tape in the cover tape contains an adhesive resin (A) and an electrically-charged resin (B) charging opposite to the charging polarity of the adhesive resin (A) generated at the time of friction between the adhesive resin (A) and the electronic device. The cover tape may have a single-layered structure or a multilayered structure. In the case of the multilayered structure, among them, the layer contacting with the carrier tape contains the electrically-charged resin (B). In the packaged article containing an electronic device 11 illustrated by FIGS. 1 and 2, heat sealant layer 4 corresponds to the layer contacting with the carrier tape.

The layer contacting with the carrier tape contains the adhesive resin (A) to be selected for good adhesive property to the carrier tape.

The adhesive resin (A) is not particularly restricted and it can be selected from a variety of resins according to the material of the carrier tape but acrylic adhesive resins, polyester adhesive resins and vinyl chloride adhesive resins are used in general. Because the charging polarity of the adhesive resin (A) is determined by the combination with the electronic device to be packaged, it is able to confirm the charging polarity of the adhesive resin (A) by generating the charge between the adhesive resin (A) and the electronic device using any publicly-known method.

The electrically-charged resin (B) used in the layer contacting with the carrier tape in the cover tape includes a positively chargeable resin (resin being capable of charging positively) or a negatively chargeable resin (resin being capable of charging negatively). By using these resins, pickup failure and static breakage of the electronic device can be prevented because the static generation between the cover tape and the electronic device can be inhibited.

The electrically-charged resin (B) is preferably a positively chargeable resin or a negatively chargeable resin having a polar group, respectively. The effect can be well obtained in the case of the polar group being contained. The polar group is not particularly restricted but includes, for example, hydroxyl group, carboxyl group, ether group, oxyalkylene group, ester group, amino group, substituted amino group, imino group, amide group, sulfonate group, phosphoric group, quaternary ammonium base and so on. Among them, positively chargeable resins having quaternary ammonium base and negatively chargeable resins having sulfonate group are preferred.

As the positively chargeable resin having a polar group, a styrene-acrylic copolymer having a quaternary ammonium base is more preferred. As the negatively chargeable resin having a polar group, a styrene-acrylic copolymer comprising 2-acrylamide-2-methylpropanate is more preferred. by using these copolymers, the pickup failure of electronic device and static breakage can be well prevented because static between the cover tape and the electronic device can be extremely successfully inhibited.

As the styrene-acrylic copolymer having a quaternasv ammonium base, a copolymer (hereinafter referred as to copolymer 1) comprising 65 to 97 weight % of the repeating unit represented by the following formula (I);

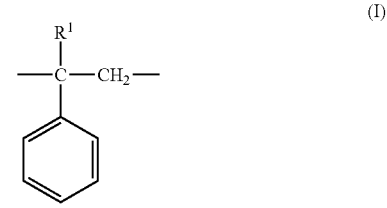

(in the formula, $R^1$ represents a hydrogen atom or a methyl group) and 35 to 3 weight % of the repeating unit represented by the formula (II);

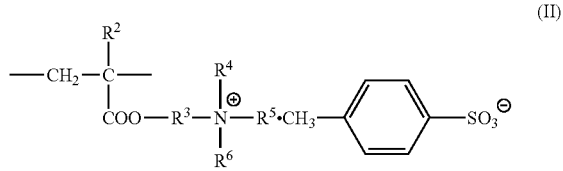

(in the formula, $R^2$ represents a hydrogen atom or a methyl group, $R^3$ represents an Alkylene group, and $R^4$, $R^5$, and $R^6$ are same or different and represents an alkyl group respectively) is especially preferred. In this case, the effect can be extremely successfully obtained.

The alkyl group and alkylene group are respectively straight-chain, branched-chain, or cyclic aliphatic hydrocarbon, and the alkyl group includes alkyl groups having 1 to 10 carbon atoms such as methyl, ethyl, n- or iso-propyl; n-, sec-, iso-, or tert-butyl; n-, sec-, iso-, or tert-amyl; n-, sec-, iso-, or tert-hexyl; n-, sec-, iso-, or tert-octyl; n-, sec-, iso-, or tert-nonyl. Among them, lower alkyl groups are preferred. As the alkylene group, for example, straight-chain or branched-chain alkylene groups having 2 to 3 carbon atoms such as ethylene and propylene are exemplified.

The unit of the formula (I) is the repeating unit induced by styrene, α-methyl styrene or their combination. The proportion of the repeating unit is out of the range, the effect of the present disclosure may be not achieved. The repeating unit of the formula (I) is preferably 65 to 97 weight %, more preferably 73 to 97 weight %, and still more preferably 78 to 95 weight % relative to the total resin. The part of the repeating unit (I) may be replaced with the repeating unit induced by (meth) acrylic alkyl ester represented by the formula (III);

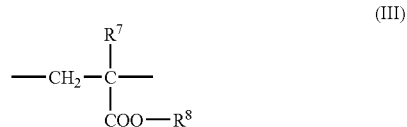

(III)

(in the formula, $R^7$ represents a hydrogen atom or a methyl group, $R^8$ represents an alkyl group (preferably, methyl, ethyl, n- or iso-propyl, n- or iso-butyl, and 2-ethylhexyl)).

On the other hand, the unit of the formula (II) is a unit induced by quaternizing dialkylaminoalkyl (meth)acrylate using the method described after. The repeating unit of the formula (II) is preferably 35 to 3 weight %, more preferably 27 to 3 weight %, and still more preferably 22 to 5 weight % relative to the total resin.

In forming the unit of the formula (II), a part of the starting monomer may not be quaternized to be unreacted or may be introduced in the form of ammonium halide which is an intermediate into the copolymer. Therefore, the copolymer 1 may contain the repeating unit represented by the following formula (IV) or (V);

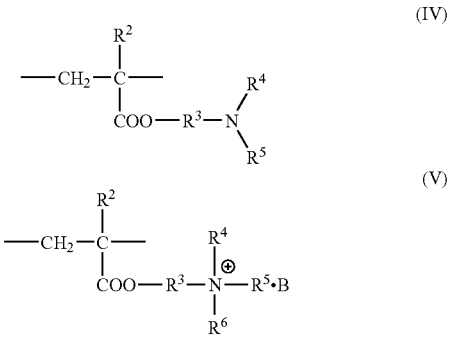

(in the formula, $R^2$, $R^3$, $R^4$, $R^5$, and $R^6$ are same as mentioned above and B represents a halogen atom).

As dialkylaminoalkyl (meth)acrylate directed to the unit of the formula (II), di (lower alkyl)aminoethyl (meth)acrylates such as dimethylaminoethyl (meth)acrylate, diethylaminoethyl (meth)acrylate, dipropylaminoethyl (meth)acrylate, dibutylaminoethyl (meth)acrylate are preferred.

The copolymer 1 can be obtained by copolymerizing styrene and/or α-methylstyrene and dialkylaminoalkyl (meth)acrylate, according to need, and (meth)acrylate alkyl ester in the presence of polymerization initiator and quartenizing the resultant copolymer using p-toluenesulfonate alkyl ester (p-toluenesulfonate methyl, p-toluenesulfonate ethyl, p-toluenesulfonate propyl and so on), or by converting dialkylaminoalkyl (meth)acrylate to quaternary ammonium halide using an alkyl halide (methyl chloride, methyl bromide, ethyl chloride, ethyl bromide, propyl chloride, propyl bromide, butyl chloride and butyl bromide), copolymerizing the resultant quaternary ammonium halide, styrene and/or α-methylstyrene and, according to need, alkylester (meth)acrylate and reacting the resultant copolymer with p-toluenesulfonate.

The polymerization initiator used in the copolymerization reaction includes publicly known materials. The polymerization method includes solution polymerization, suspension polymerization, bulk polymerization and other methods.

The weight average molecular weight of the copolymer 1 is preferably 2000 to 10000, more preferably 3000 to 8000. In the present disclosure, weight average molecular weight is measurement value from GPC measurement (gel permeation chromatography) on polystyrene basis.

On the other hand, as styrene-acrylic copolymer comprising 2-acrylamide-2-methylpropanate as a monomer, a copolymer obtained by copolymerizinq styrene and/or α-methylstyrene and 2-acrylamide-2-methylpropanesulfonate in the copolymerization ratio (weight atio) of 98:2 to 80:20 (preferably 95:5 to 87:13) (hereinafter called as copolymer 2) is especially preferred. In this case, the effect can be extremely sufficiently obtained.

The polymerization initiator which can be used in the copolymerization of styrene and/or α-methylstyrene and 2-acrylamide-2-methylpropanesulfonate includes publicly known materials. As the polymerization method, solution polymerization, suspension polymerization, bulk polymerization and other methods can be applied.

The weight average molecular weight of the copolymer 2 is preferably 2000 to 15000, more preferably 3000 to 8000.

In the layer contacting with the carrier tape, the addition amount of the electrically-charged resin (B) may be adjusted according to the electronic device causing friction, but is preferably 1 to 100 weight parts relative to 100 parts of other resin components than the electrically-charged resin (B) in the layer. For example, in the case of an electronic device made of epoxy resins, it is preferably 3 to 70 weight parts, more preferably 10 to 50 weight parts. When less than 1 weight part, the effect to inhibit the surface potential generated at the surface of the electronic device may not be obtained. When exceeding 100 weight parts, it may undermine the effect of the present disclosure, and pickup failure and static breakage of the electronic device due to ESD may occur. That is, when the addition amount of the electrically-charged resin (B) exceeds 100 weight parts, the charge quantity of the cover tape may increase beyond the needed quantity to negate and reduce the initial charge at the surface of the electronic device. In this case, the effect of the present disclosure may be negated because the surface of the electronic device makes charge opposite to the initial charge excessively. When the amount exceeds 100 weight parts, the sealing property needed for the cover tape may be affected.

The layer contacting with the carrier tape contains 2 to 1000 weight parts of conducting substance relative to 100 weight parts of the resin composition, the surface resistance value of the layer (the layer contacting with the carrier tape) being preferably $1 \times 10^9$ to $1 \times 10^{12} \Omega/\square$ according to JIS K 6911. By satisfying this condition, it is able to inhibit the impact of static generated in other spots on the electronic device during processes.

When the addition amount of the conducting substance is less than 2 weight parts, the surface resistance value may exceed $10^{12}$. When exceeding 1000 weight parts, a film may not be obtained. The addition amount of the conducting substance is more preferably 5 to 400 weight parts.

If the surface resistance value is less than $10^4 \Omega/\square$, the resistance is too low when the charge occurs outside of taped article (the career tap sealed with the cover tape) so that it may cause the static breakage to carry an electric current to the electronic device in the taped article. When the surface resistance value exceeds $10^{12} \Omega/\square$, it makes static-diffusion capability insufficient and causes troubles because the intended electricity-removal property is not exerted so that the cover tape takes charge.

The conducting substance includes, for example, metallic fillers such as tin oxide, zinc oxide, titanium oxide, carbon, organic conducting substance such as conducting polymers, and mixture thereof and substances containing them. Carbon includes various shaped fillers made of carbon such as carbon black, white carbon, carbon fiber, carbon tube and so on. In the present disclosure, the dispersion condition is changed to different condition than usual by adding the electrically-charged resin (B) because the filler has inherent electrical potential, and there is a possibility that electrical property and transparency do not reach the needed level because of the influence of inherent aggregation and electrostatic repulsion. Therefore, it is preferred to add in the range where such trouble is not occurred.

To prevent blocking, the layer contacting with the carrier tape may contain at least one selecting from the group consisting of oxide particles containing silicon, magnesium, or calcium as a main component such as, for example, silica, talc; polyethylene particles; polyacrylate particles; polystyrene particles; or an alloy thereof.

The method for forming the layer contacting with the carrier tape is not particularly restricted but includes publicly known methods, gravure coating method being preferred.

As one of preferred example of layer constitution in the cover tape, a multilayer film comprising at least three layers of a substrate layer, an intermediate layer and a heat sealant layer is exemplified, wherein the heat sealant layer is the layer contacting with the carrier tape (FIG. 1 illustrates one example of this embodiment which comprises another adhesion layer). In the case of this film constitution, the effect can be well obtained.

In the cover tape, the material used in the substrate layer includes, for example, polyester films, nylon films, polyolefin films that are biaxially-stretched, respectively. The biaxially-stretched polyethylene terephthalate film is preferred from the viewpoint of heat resistance on heat sealing. When rigidity and tear resistance is needed for the cover tape, it may be multilayered with two or more films. When the substrate layer comprises two or more layers, those may be different materials.

The thickness of the substrate layer is preferably 5 to 30 µm, and preferably transparent and high in rigid. When the thickness is less than 5 µm, rigid will disappear and it will be easier for the cover tape to break. When the thickness exceeds 30 µm, there is a possibility that sealing becomes unstable because the layer becomes too hard.

In the cover tape, the heat sealant layer is the outermost layer of the cover tape and is usually single layered.

In the present disclosure, the heat sealant layer corresponds to the layer contacting with the carrier tape and contains the same components as mentioned above.

In the cover tape, the intermediate layer exists between the heat sealant layer and the substrate layer and the layer which generates cohesion failure on the peeling after heat sealing. This intermediate layer is preferably situated next to the heat sealant layer. This may be single layered or multilayered.

The material of the intermediate layer includes, for example, a resin alloy being poor in compatibility such as an alloy of polyethylene and styrene, and polyethylene. A compatibilizing agent for adjusting peeling strength may be added. The thickness of the intermediate layer is preferably 5 to 50 µm. The method for forming the intermediate layer is preferably extrusion lamination method from the viewpoint of cost and efficiency.

In the cover tape, the adhesive layer exists between other layers than the heat sealant layer. In the FIGS. 1 and 2 which illustrate one embodiment of the present disclosure, the adhesive layer exists between the substrate layer and the intermediate layer, but when the substrate layer and the intermediate layer is composed of two or more layers respectively, it should be placed only between arbitrary two layers.

As the adhesive layer, a layer containing a resin may be used. The adhesive layer may contain a conductive substance.

The resin includes urethane adhesive resins for dry lamination or anchor coating, which is generally combined mixture of a polyester composition such as polyesterpolyol and polyetherpolyol and an isocyanate compound. As the conductive substance, the same as mentioned above can be used. The conductive substance may be added after the polyester compound and the isocyanate compound are mixed, but is preferably added to either resin in advance in viewpoint of stable reaction condition. The method for forming the adhesive layer includes the coating and so on.

The surface resistance value of the adhesive layer is preferably not more than $10^{10} \Omega/\square$. When exceeding $10^{10} \Omega/\square$, electrical conductivity is insufficient and the effect to inhibit the static induction phenomenon is not exerted, so that the cover tape charges and may cause troubles such as ESD and pickup failure. It is preferred to keep the surface resistance value under $10^{10} \Omega/\square$, because the environment during flow of production where the cover tape is peeled off is sometimes in a dry condition in winter.

Concerning the adhesion layer, the layer is set as an adhesive agent for dry lamination if the layer is set between a stretched film—a stretched film. The layer is set as an agent for anchor coating if the layer is set between a stretched film—the intermediate layer.

The packaged article containing an electronic device of the present disclosure comprises a carrier tape containing an electronic device. The carrier tape is not particularly restricted but includes a plastic embossed carrier tape and so on.

Specifically, sheets obtained by providing sheets made of vinyl chloride resin, polyester resin, polystyrene resin, or polycarbonate resin with conductive property are used generally.

In the carrier tape, as the method for providing with conductive property to obtain the charging prevention performance, a method of forming a sheet from a mixture obtained by mixing carbon black in these resins, or a method of coating a coating composition containing carbon black onto a substrate sheet made of these resins is generally used. The method for producing the embossed carrier tape includes a method of molding the sheet to the intended shape by vacuum molding method, pressured molding, press molding and so on.

The electronic device is not particularly restricted but includes, for example, IC and other devices such as transistor, diode, condenser and pressure element register.

In the present disclosure, the above-mentioned effect can be well obtained even if small and light weight electronic device is contained. For example, even if the device is 0.0008 to 0.008 cc in size or 0.2 to 2 g in weight, it is preferred. Even if the area of the side facing the cover tape in the electronic device is 0.02 to 4.0 $mm^2$, it is preferred.

It's often the case that the side facing the cover tape in the electronic device is made of encapsulation resin, a resin composition containing a thermosetting resin and a curing agent, according to need, a filler, a curing accelerator, or an oil component for good moldability being used.

The thermosetting resin is a resin which is able to thermally hardening the resin composition for the last time, and can improve the heat resistance after sealing.

The thermosetting resin includes, for example, epoxy resins, urea resins, resins having a triazine ring such as melamine resins, unsaturated polyester resins, bismaleimide resins, polyurethane resins, diallyl phthalate resins, silicone resins, resins having a benzoxazine ring, cyanate ester resins and so on. Among them, epoxy resins are preferred. In the case of an electronic device using an epoxy resin, it is able to prevent the pickup failure and static breakage of the electronic device because it can inhibit the static generation between the cover tape and the electronic device.

The epoxy resin includes a resin having two or more epoxy groups in the molecule, for example, epoxy resins including novolac-type phenolic resins such as phenol novolac resins, cresol novolac resins, and bisphenol A novolac resin; phenol resins such as resol-type phenolic resins; novolac-type epoxy resins such as phenol novolac-type epoxy resins, and cresol novolac-type epoxy resin; bisphenol-type epoxy resins such as bisphenol A epoxy resins and bisphenol F epoxy resins; aromatic glycidylamine-type epoxy resins such as N,N-diglycidyl aniline, N,N-diglycidyl toluidine, diamino diphenyl methane-type glycidyl amine, and aminophenol-type glycidylamine; hydroquinone-type epoxy resins, biphenyl-type epoxy resins, stilbene-type epoxy resins, triphenol methane-type epoxy resins, triphenol propane-type epoxy resins, alkyl-modeified triphenol methane-type epoxy resins, triazine nucleus-containing epoxy resins, dicyclopentadiene-modified phenol-type epoxy resins, naphthol-type epoxy resins, naphthalene-type epoxy resins, aralkyl-type epoxy resins such as phenol aralkyl-type epoxy resins having a phenylene and/or biphenylene skeleton and naphthol aralkyl-type epoxy resins having a phenylene and/or biphenylene skeleton; aliphatic epoxy resins including cyclic epoxy resin such as vinylcyclohexene dioxide, dicyclopenta diene oxide and aycyclic diepoxy-adipimide. These may be used either singly or in combination.

The curing agent to be used in the resin composition includes, for example, polyaddition-type curing agents, catalyst-type curing agents, condensation-type curing agents and flux activity-containing curing agents.

The packaged article containing electronic device Of the present invention includes (1) one obtained by using an acrylic resin as the adhesive resin, a negatively chargeable resin having polar group (especially styrene-acrylic copolymer obtained by using 2-acrylamide-2-methylpropanate as a monomer) as the electrically-charged resin and an epoxy resin as the sealing resin of the elctronic device and (2) one obtained by using a vinyl chloride adhesive resin as the adhesive resin, positively chargeable resin having a polar group (especially styrene-acrylic copolymer having a quaternary ammonium base) as the electrically-charged resin and an epoxy resin as the sealing resin of the electronic device.

The method for producing the packaged article containing an electronic device of the present disclosure is not particularly restricted but it can be produced by putting an electronic device into the molding pocket of the carrier tape such as an embossed carrier tape using a known taping machine and sealing with the cover tape as a lid material.

EFFECT OF THE DISCLOSURE

The packaged article containing an electronic device of the present disclosure, which has the above-mentioned constitution, can inhibit the static generation due to friction between the electronic device (especially small and light weight electronic device) and the cover tape to prevent the adhesion of the electronic device to the cover tape due to the static and the device breakage due to ESD sufficiently.

DESCRIPTION OF THE NUMERALS

Figure 1:
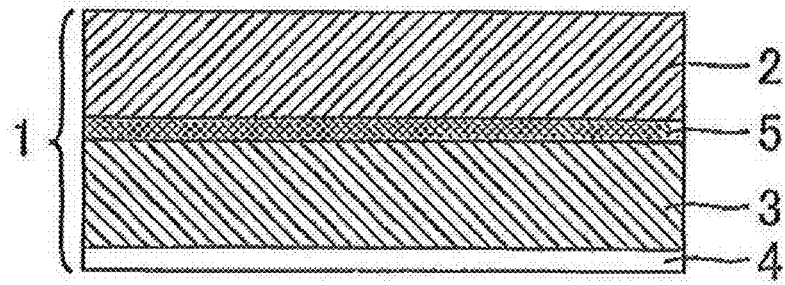
FIG. 1 illustrates a cross-section view of one embodiment of layer constitution of the cover tape 1 used in the present disclosure.
Figure 2:
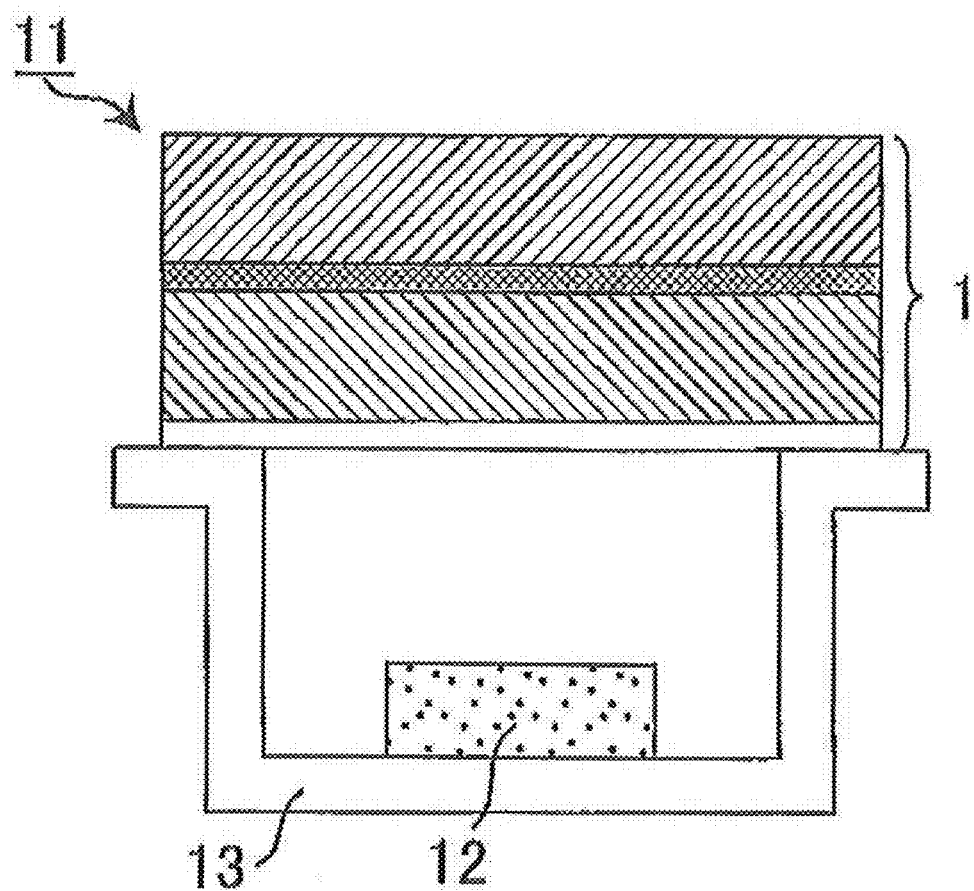
FIG. 2 is a view showing a frame format of packaged article containing an electronic device 11 of the present disclosure using the cover tape of FIG. 1.

1 Cover tape
2 Substrate layer
3 Intermediate layer
4 Heat sealant layer
5 Adhesive layer
11 Packaged article containing an electronic device
12 Electronic device
13 Carrier tape

BEST MODE FOR CARRYING OUT THE INVENTION

Hereinafter, the present disclosure will be described in more detail by way of examples, but the present disclosure is not limited to these examples. In examples, "part" and "%" mean "weight part" and "weight %" respectively, unless otherwise specified.

Examples and Comparative Examples

Using a substrate film (substrate layer) having film thickness of 25 μm as a outside layer, a film having total film thickness of 40 μm was obtained by setting an intermediate layer of 15 μm on the substrate film by extrusion lamination method. After the surface thereof was activated by corona treatment method, a film (cover tape) was obtained by coating the composition shown in the Tables 1 and 2 to form a heat sealant layer (1 μm thickness after drying).

An electronic device was put into a polystyrene carrier tape with 8 mm width, after the obtained cover tape was slit to the degree of 5.5 mm width, it was heat sealed with the carrier tape adjusting the heat seal temperature so that the strength at the time of peeling off was 40 cN to obtain a packaged article containing an electronic device (size of a heat iron on heat sealing: 0.4 mm width×8 mm length, double file/hit twice).

The constitutions of the substrate layer and the intermediate layer, components of the heat sealant layer, and materials of the electronic devices that are used in each example and comparative example are shown in Tables 1 and 2.

[Measurement of Charging Polarity on the Adhesive Resin when Friction is Generated Between the Adhesive Resin and the Electronic Device]

The charging polarity of the adhesive resin surface immediately after the friction was generated between the adhesive resin (A) and the electronic device, before adding an electrically-charged resin (B), was measured by Surface Electrometer manufactured by ETS Corporation.

[Measurement of Charge Quantity]

As for the samples of packaged articles containing an electronic device obtained by examples and comparative examples, an attachment of the electronic device at the time of peeling off was observed. At first; hundred electronic devices which were taped were subjected to vibration test of 300 RT/min. for one minute and they were peeled off at the speed of 300 mm/min. so that the attachment of the electronic device was not occurred in each sample.

As an alternate evaluation, the charge quantity was measured when the layer contacting with the carrier tape in the cove tape in the packaged articles containing an electronic device of examples and comparative examples (heat sealant layer) and five electronic devices (size: 1 mm×2 mm×1 mm, weight: 0.01 g, the area of the side facing the cover tape 2 mm$^2$) were vibrated at 600 rpm/min. for three minutes.

(Measurement)

Charge quantity of the electronic device after friction (frictional charge quantity) was measured by using Faraday gauge manufactured by ETS Corporation. Results were shown in Tables 1 and 2.

[Film Condition]

Film condition was observed with the eye and it was evaluated as "Good" if there was no problem, it being evaluated as "No film" if there was film unevenness or film hole.

[Surface Resistance Value ($\Omega/\square$)]

The measurement was performed according to JIS K6911 at 23° C. and −50% RH.

TABLE 1

|  |  | Example 1 |  | Example 2 |  | Example 3 |  |
|---|---|---|---|---|---|---|---|
| Constitution of the substrate layer |  | o-PET/o-Ny | 25 μm | n-Ny | 25 μm | o-PET | 25 μm |
| Constituion of the intermediate layer |  | PE | 15 μm | PP | 15 μm | Polystyrene | 15 μm |
| Heat sealant layer | Adhesive resin | Ac | 100 parts | Sv | 100 parts | Ac | 100 parts |
|  | Electrically-charged resin | NS | 30 parts | PS | 50 parts | NS | 70 parts |
|  | Conductive substance | ATO | 300 parts | ZO | 500 parts | ATO | 200 parts |
| Material of the electronic device |  | Epoxy |  | Epoxy |  | Epoxy |  |
| Charging polarity on the adhesive resin at the time of friction between the adhesive resin and the electronic device |  | Positive (+) |  | Negative (−) |  | Positive (+) |  |
| Results | Frictional charge quantity of the device (nC) | −0.02 |  | 0.08 |  | 0.26 |  |
|  | Film condition | Good |  | Good |  | Good |  |
|  | Surafce resistance value ($\Omega/\square$) | $1 \times 10^8$ |  | $1 \times 10^9$ |  | $1 \times 10^7$ |  |

|  |  | Example 4 |  | Example 5 |  | Example 6 |  |
|---|---|---|---|---|---|---|---|
| Constitution of the substrate layer |  | o-PP | 25 μm | o-PP | 25 μm | o-PP | 25 μm |
| Constituion of the intermediate layer |  | PE | 15 μm | PE | 15 μm | PE | 15 μm |
| Heat sealant layer | Adhesive resin | Ac | 100 parts | Ac | 100 parts | Ac | 100 parts |
|  | Electrically-charged resin | NS | 3 parts | NS | 10 parts | NS | 50 parts |
|  | Conductive substance | CB | 3 parts | ATO | 300 parts | ATO | 300 parts |
| Material of the electronic device |  | Epoxy |  | Epoxy |  | Epoxy |  |
| Charging polarity on the adhesive resin at the time of friction between the adhesive resin and the electronic device |  | Positive (+) |  | Positive (+) |  | Positive (+) |  |
| Results | Frictional charge quantity of the device (nC) | −0.29 |  | −0.09 |  | 0.09 |  |
|  | Film condition | Good |  | Good |  | Good |  |
|  | Surafce resistance value ($\Omega/\square$) | $1 \times 10^9$ |  | $1 \times 10^9$ |  | $1 \times 10^9$ |  |

TABLE 2

|  |  | Comparative Example 1 |  | Comparative Example 2 |  | Comparative Example 3 |  |
|---|---|---|---|---|---|---|---|
| Constitution of the substrate layer |  | o-PET | 25 μm | o-PET | 25 μm | o-PET | 25 μm |
| Constituion of the intermediate layer |  | PE | 15 μm | PE | 15 μm | Polystyrene | 15 μm |
| Heat sealant layer | Adhesive resin | Ac | 100 parts | Ac | 100 parts | Ac | 100 parts |
|  | Electrically-charged resin | None | 0 part | PS | 20 parts | PS | 5 parts |

TABLE 2-continued

|  |  | | | | | | |
|---|---|---|---|---|---|---|---|
| | Conductive substance | ATO | 300 parts | ZO | 500 parts | CB | 1 part |
| Material of the electronic device | | Epoxy | | Epoxy | | Epoxy | |
| Charging polarity on the adhesive resin at the time of friction between the adhesive resin and the electronic device | | Positive (+) | | Positive (+) | | Positive (+) | |
| Results | Frictional charge quantity of the device (nC) | −0.35 | | −0.45 | | −0.32 | |
| | Film condition | Good | | Good | | Good | |
| | Surafce resistance value (Ω/□) | $1 \times 10^7$ | | $1 \times 10^{10}$ | | $1 \times 10^{12}<$ | |

| | | Comparative Example 4 | | Comparative Example 5 | |
|---|---|---|---|---|---|
| | Constitution of the substrate layer | o-PET | 25 μm | o-Ny | 25 μm |
| | Constituion of the intermediate layer | PE | 15 μm | PP | 15 μm |
| Heat sealant layer | Adhesive resin | Ac | 100 parts | Sv | 100 parts |
| | Electrically-charged resin | PS | 5 parts | None | 0 part |
| | Conductive substance | ATO | 1000 parts | ZO | 500 parts |
| Material of the electronic device | | Epoxy | | Epoxy | |
| Charging polarity on the adhesive resin at the time of friction between the adhesive resin and the electronic device | | Positive (+) | | Negative (−) | |
| Results | Frictional charge quantity of the device (nC) | Inoperativeness | | 0.35 | |
| | Film condition | No film | | Good | |
| | Surafce resistance value (Ω/□) | Inoperativeness | | $1 \times 10^9$ | |

The following compounds were used as the numerals and presentments in tables 1 and 2.

o-PET: biaxially-stretched polyethylene terephthalate (manufactured by TOYOBO, T6140)

o-PP: biaxially-stretched polypropylene (manufactured by TOYOBO, P2282)

PE: polyethylene (manufactured by SUMITOMO CHEMICAL, L705)

PP: polypropylene (manufactured by SUNALLOMER, PC540R)

Polystyrene: manufactured by PS Japan, PSJ-polystyrene 679

Ac: Acrylic adhesive resin (manufactured by DIC Corporation, A450A)

Sv: Vinyl chloride adhesive resin (manufactured by Nissin Chemical Industry, SOLBAIN M)

PS: Positively chargeable resin (manufactured by Fujikura Kasei Co. Ltd., FCA-201-PS)

NS: Negatively chargeable resin (manufactured by Fujikura Kasei Co. Ltd., FCA-1001-NS)

ATO: Tin oxide (manufactured by Mitsubishi Materials Corporation, T-1)

ZO: Zinc oxide (manufactured by HAKUSUI TECH, PAZET CK)

CB: Carbon black (manufactured by LION Corporation, KETJEN BLACK EC600JD)

The friction charge quantity in the examples was quite small. Therefore, it was expected to prevent the pickup failure and the device breakage due to ESD sufficiently. Film condition and surface resistance value were good, too. On the other hand, the friction charge quantity in the comparative examples was large or could not be measured.

INDUSTRIAL APPLICABILITY

The packaged article containing an electronic device of the present disclosure can be used as a packaged article which contains an electronic device used in the electronic circuit substrate.

The invention claimed is:

1. A packaged article containing an electronic device which comprises an electronic device-packaging carrier tape and an electronic device-packaging cover tape,
   wherein a layer in said cover tape contacting with said carrier tape contains, in combination: an adhesive resin (A), an electrically-charged resin (B) charging opposite to the charging polarity of said adhesive resin (A) generating at the time of friction between said adhesive resin (A) and said electronic device, and at least one of a metallic filler and carbon, wherein
   the electrically-charged resin (B) has a polar group.

2. The packaged article containing an electronic device according to claim 1,
   wherein the electrically-charged resin (B) is a positive charging resin or a negative charging resin.

3. The packaged article containing an electronic device according to claim 1,
   wherein the electrically-charged resin (B) is a styrene-acrylic copolymer having a quaternary ammonium base or a styrene-acrylic copolymer obtained by using 2-acrylamide-2-methyl propanate as a monomer.

4. The packaged article containing an electronic device according to claim 1,
   wherein the cover tape is a multilayer film having at least three layers comprising a substrate layer, an intermediate layer, and a heat sealant layer and
   said heat sealant layer contacts with the carrier tape.

5. The packaged article containing an electronic device according to claim 1, wherein an addition amount of the electrically-charged resin (B) is 1 to 100 parts by weight relative to 100 parts by weight of the resin component in the layer contacting with the carrier tape.

6. The packaged article containing an electronic device according to claim 1, wherein the layer contacting with the carrier tape contains a conductive substrate of 30 to 1000 parts by weight relative to 100 parts by weight of the resin component and the surface resistance value of the layer is $1\times10^4$ to $1\times10^{12} \Omega/\square$.

7. The packaged article containing an electronic device according to claim 1, 2, 3, 4, 5 or 6, wherein the metallic filler is at least one selected from the group consisting of tin oxide, zinc oxide, and titanium oxide.

* * * * *